(12) United States Patent
Cass et al.

(10) Patent No.: US 10,347,840 B2
(45) Date of Patent: Jul. 9, 2019

(54) ORGANIC LIGHT-EMITTING POLYMER AND DEVICE

(71) Applicants: Cambridge Display Technology Limited, Godmanchester (GB); Sumitomo Chemical Company Limited, Tokyo (JP)

(72) Inventors: Michael Cass, Cambridge (GB); Matthew Roberts, Cambridge (GB); Florence Bourcet, Godmanchester (GB); Andrey Nikolaenko, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 380 days.

(21) Appl. No.: 15/045,327

(22) Filed: Feb. 17, 2016

(65) Prior Publication Data

US 2016/0240785 A1 Aug. 18, 2016

(30) Foreign Application Priority Data

Feb. 18, 2015 (GB) .................................. 1502732.9

(51) Int. Cl.
*H01L 51/00* (2006.01)
*C08G 61/12* (2006.01)
(Continued)

(52) U.S. Cl.
CPC .......... *H01L 51/0035* (2013.01); *C08G 61/12* (2013.01); *C08G 61/122* (2013.01);
(Continued)

(58) Field of Classification Search
CPC ............. H01L 51/0032; H01L 51/0043; H01L 51/5004; H01L 51/5012; H01L 51/5016;
(Continued)

(56) References Cited

U.S. PATENT DOCUMENTS

| 7,772,323 B2* | 8/2010 | Becker .................... C07F 5/025 525/133 |
| 2013/0247990 A1* | 9/2013 | Facchetti ............ H01L 51/0035 136/263 |
| 2014/0151660 A1 | 6/2014 | Kamtekar et al. |

OTHER PUBLICATIONS

Combined Search and Examination Report for corresponding Great Britain Application No. GB1502732.9, dated Sep. 21, 2015, pp. 1-8.
(Continued)

*Primary Examiner* — Susan D Leong
(74) *Attorney, Agent, or Firm* — Wolf, Greenfield & Sacks, P.C.

(57) ABSTRACT

A polymer comprising a fluorescent light-emitting repeating unit comprising a group of formula ED-EA wherein ED is an electron-donating unit; EA is an electron-accepting unit; and a band gap $Eg_{CT}$ of a charge-transfer state formed from the electron-donating unit and the electron-accepting unit is smaller than the bandgap of either the electron-accepting unit $Eg_{EA}$ or that of the electron-donating unit $Eg_{ED}$.

16 Claims, 7 Drawing Sheets

(51) Int. Cl.
*C09K 11/06* (2006.01)
*H01L 51/50* (2006.01)

(52) U.S. Cl.
CPC .......... *C09K 11/06* (2013.01); *H01L 51/0043* (2013.01); *C08G 2261/12* (2013.01); *C08G 2261/148* (2013.01); *C08G 2261/1412* (2013.01); *C08G 2261/312* (2013.01); *C08G 2261/3142* (2013.01); *C08G 2261/3162* (2013.01); *C08G 2261/3221* (2013.01); *C08G 2261/3245* (2013.01); *C08G 2261/3424* (2013.01); *C08G 2261/411* (2013.01); *C08G 2261/522* (2013.01); *C08G 2261/524* (2013.01); *C08G 2261/95* (2013.01); *C09K 2211/1433* (2013.01); *C09K 2211/1466* (2013.01); *C09K 2211/1475* (2013.01); *H01L 51/5004* (2013.01); *H01L 51/5012* (2013.01); *H01L 51/5016* (2013.01); *H01L 2251/552* (2013.01)

(58) Field of Classification Search
CPC . H01L 2251/552; C08G 61/12; C08G 61/122; C08G 2261/12; C08G 2261/1412; C08G 2261/148; C08G 2261/312; C08G 2261/3142; C08G 2261/3162; C08G 2261/3221; C08G 2261/3245; C08G 2261/3424; C08G 2261/411; C08G 2261/522; C08G 2261/524; C08G 2261/95; C09K 11/06; C09K 2211/1433; C09K 2211/1466; C09K 2211/1475
See application file for complete search history.

(56) References Cited

OTHER PUBLICATIONS

Chihaya Adachi, Third-generation organic electroluminescence materials, Japanese Journal of Applied Physics, 2014, vol. 53, pp. 060101-1 to 060101-11.

Sheng Bang Lim et al., New Moderate Bandgap Polymers Containing Alkoxysubstituted-Benzo[c][1,2,5]Thiadiazole and Thiophene-Based Units, Journal of Polymer Science, Part A: Polymer Chemistry, 2011, vol. 49, pp. 4387-4397.

Murali M.G. et al., Design and Synthesis of New Low Band Gap Organic Semiconductors for Photovoltaic Applications, Proc. of SPIE, 2014, vol. 8987, pp. 896729-1 to 896729-10.

* cited by examiner

ORGANIC LIGHT-EMITTING POLYMER AND DEVICE

RELATED APPLICATIONS

This application claims the benefits under 35 U.S.C. § 119(a)-(d) or 35 U.S.C. § 365(b) of British application number GB 1502732.9, filed Feb. 18, 2015, the entirety of which is incorporated herein.

BACKGROUND

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED comprises an anode, a cathode and one or more organic light-emitting layers between the anode and cathode. Non-emissive layers, for example charge transporting layers, may be provided between the anode and cathode.

Suitable light-emitting materials include small molecule, polymeric and dendrimeric materials. Suitable light-emitting polymers include poly(arylene vinylenes) such as poly (p-phenylene vinylenes) and polyarylenes such as polyfluorenes.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

Theoretically, 25% of excitons are singlet excitons, that can emit light from a singlet excited state, the remaining 75% of excitons being triplet excitons. Radiative decay from a triplet excited state is formally forbidden, however emission from a triplet excited state by spin-orbit coupling using heavy transition metal complexes is known. However, typically phosphorescent materials are rare metals, for example, iridium or platinum complexes. Blue phosphorescent emission remains a problem.

Thermally activated delayed fluorescence (TADF) is disclosed in the Japanese Journal of Applied Physics 53, 060101 (2014).

It is an object of the invention is to provide efficient organic light-emitting materials and devices.

It is a further object of the invention to provide efficient organic blue light-emitting materials and devices.

SUMMARY OF THE INVENTION

In a first aspect the invention provides a polymer comprising a light-emitting repeating unit comprising a group of formula ED-EA wherein ED is an electron-donating unit; EA is an electron-accepting unit; and a band gap $Eg_{CT}$ of a charge-transfer state formed from the electron-donating unit and the electron-accepting unit is smaller than the bandgap of either the electron-accepting unit $Eg_{EA}$ or that of the electron-donating unit $Eg_{ED}$.

In a second aspect the invention provides a method of forming a polymer according to the first aspect, the method comprising the steps of polymerising a first monomer comprising the electron-donating unit ED and a second monomer comprising the electron-accepting unit EA.

In a third aspect the invention provides an organic light-emitting device comprising an anode, a cathode and a light-emitting layer comprising a polymer according to the first aspect between the anode and the cathode.

DETAILED DESCRIPTION OF THE INVENTION

Figure 1:
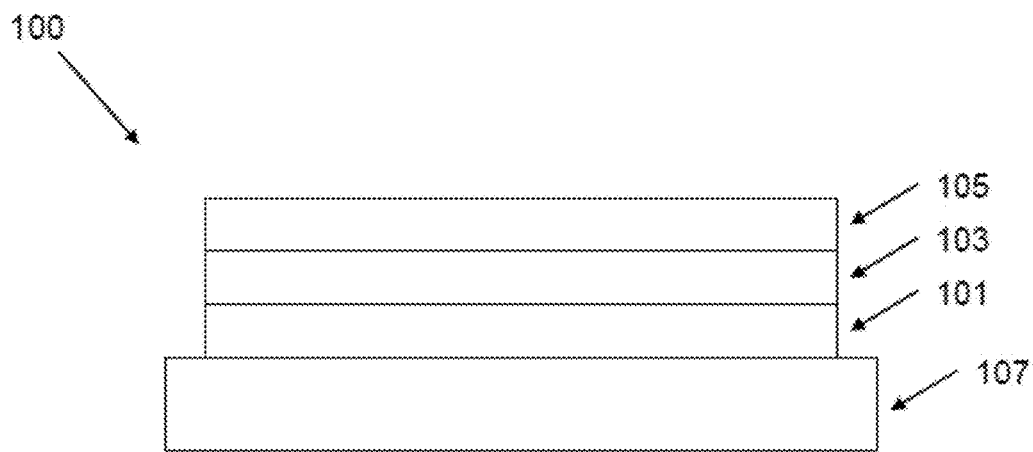
FIG. 1 illustrates an OLED 100 according to an embodiment of the invention.

With reference to FIG. 1, an OLED 100 according to an embodiment of the invention has an anode 101, a cathode 105 and a light-emitting between the anode and the cathode. The device is supported on a substrate 107, which may be a glass or plastic substrate.

The light-emitting layer comprises a fluorescent light-emitting polymer comprising a light-emitting repeat unit that emits light by thermally activated delayed fluorescence (TADF).

The light-emitting unit comprises formula ED-EA wherein ED is an electron-donating unit and EA is an electron-accepting unit.

The light-emitting unit may be provided in the backbone of the polymer wherein one or both of ED and EA is in the backbone of the polymer; in a sidechain pendant from the polymer backbone; or as an end group of the polymer.

Preferably, the light-emitting unit is in the backbone of the polymer and both of ED and EA are in the backbone of the polymer.

One or more further layers may be provided between the anode and the cathode.

Optionally, further layers may be selected from one or more of a hole-injection layer, a hole-transporting layer, an electron-blocking layer, a electron-transporting layer and an electron blocking layer.

Exemplary OLED layer structures include the following:
Anode/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode.

Preferably, a hole-injection layer is present between the anode and the light-emitting layer.

Preferably, a hole-transporting layer is present between the anode and the light-emitting layer.

Preferably, both of a hole-injection layer and a hole-transporting layer are present.

Substantially all light emitted from the device may be from the light-emitting layer, or emission may be from the light-emitting layer and one or more other layer(s) of the device.

Light-emitting polymers as described herein suitably have a polystyrene-equivalent number-average molecular weight (Mn) measured by gel permeation chromatography in the range of about $1 \times 10^3$ to $1 \times 10^8$, and preferably $1 \times 10^3$ to $5 \times 10^6$. The polystyrene-equivalent weight-average molecular weight (Mw) of the polymers described herein may be $1 \times 10^3$ to $1 \times 10^8$, and preferably $1 \times 10^4$ to $1 \times 10^7$.

Light-emitting polymers as described herein are preferably amorphous.

Figure 2:
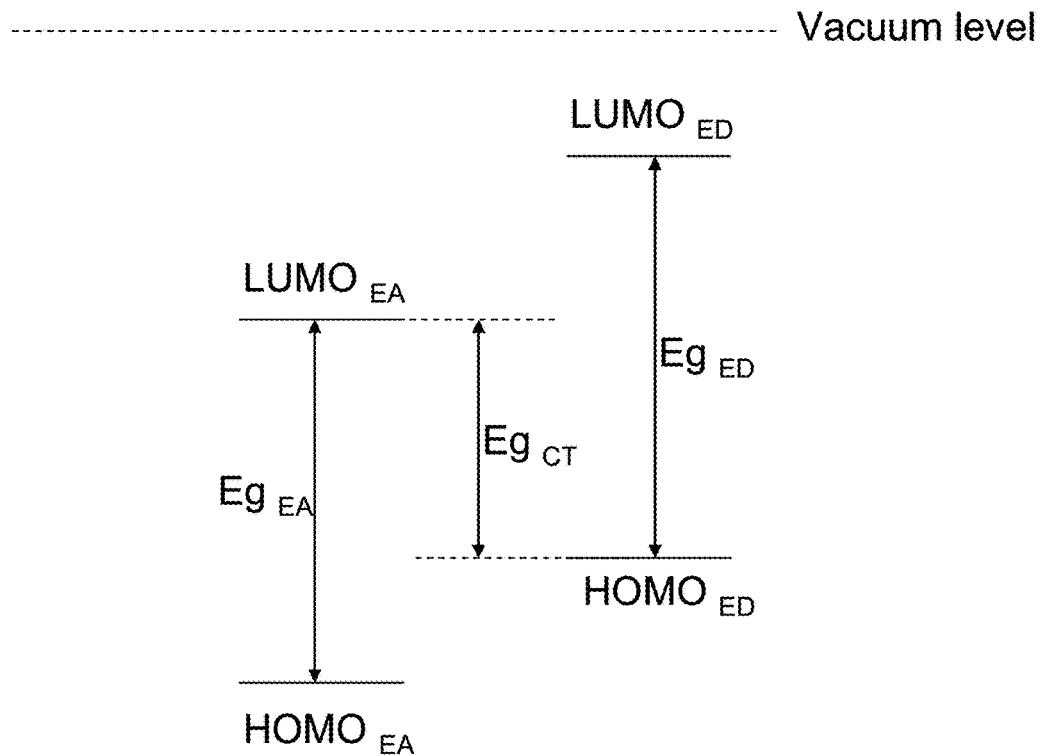
FIG. 2 illustrates a TADF unit formed from an electron-accepting unit EA and an electron-donating unit ED

FIG. 2, which is not drawn to any scale, schematically illustrates a TADF unit formed from an electron-accepting unit EA and an electron-donating unit ED.

The electron-accepting unit EA and an electron-donating unit ED form a charge-transfer state CT. The band gap $Eg_{CT}$ of the charge-transfer state is smaller than that of either the electron-accepting unit $Eg_{EA}$ or that of the electron-donating unit $Eg_{ED}$. The extent of conjugation between the ED and EA units may be controlled, for example by providing a substituent on at least one position adjacent to a bond between ED and EA to create a twist between ED and EA and/or selecting the linking position between ED and EA.

Substituents on at least one position adjacent to a bond between ED and EA include $C_{1-30}$ hydrocarbyl groups, optionally $C_{1-20}$ alkyl, unsubstituted phenyl, and phenyl substituted with one or more $C_{1-10}$ alkyl groups. In the case where there is a carbon-carbon bond between an aryl or heteroaryl group of ED and an aryl or heteroaryl group of EA, the substituent may be provided on a carbon atom of the aryl or heteroaryl group of EA and/or a carbon atom of the aryl or heteroaryl group of ED that is adjacent to the ED-EA carbon-carbon bond. In a preferred embodiment, the carbon-carbon bond is between an aryl group, preferably a phenyl group, of EA and an aryl group, preferably a phenyl group, of ED, and a substituent is provided on one or more of the carbon atoms of the aryl groups adjacent to the carbon-carbon bond.

If the bond between EA and ED is a carbon-carbon bond between a phenylene group of EA and an arylene or heteroarylene group of ED, or between a phenylene group of ED and an arylene or heteroarylene group of EA, then the phenylene group is optionally para-linked or meta-linked.

The extent of conjugation between EA and ED may be reduced if the phenylene is meta-linked as compared to a para-linked phenylene.

The present inventors have surprisingly found that limiting the extent of conjugation between EA and ED can result in peak efficiency at a higher brightness.

The colour of emission of the TADF unit depends, in part, on the value of Eg $C_T$.

For a red light-emitting material, $Eg_{CT}$ is preferably less than about 2.5 eV, optionally more than 2.0 eV, optionally about 2.2 eV±0.2 eV.

For a green light-emitting material, $Eg_{CT}$ is preferably about 2.5 eV±0.2 eV.

For a blue light-emitting material, $Eg_{CT}$ is preferably about 2.8 eV±0.2 eV.

$LUMO_{ED}$ is closer to vacuum level than $LUMO_{EA}$.
$HOMO_{ED}$ is closer to vacuum level than $HOMO_{EA}$.

Preferably, $LUMO_{EA}$ is in the range 2.2-3.8 eV from vacuum level.

Preferably, $HOMO_{ED}$ is in the range of 4-6 eV from vacuum level.

Figure 3:
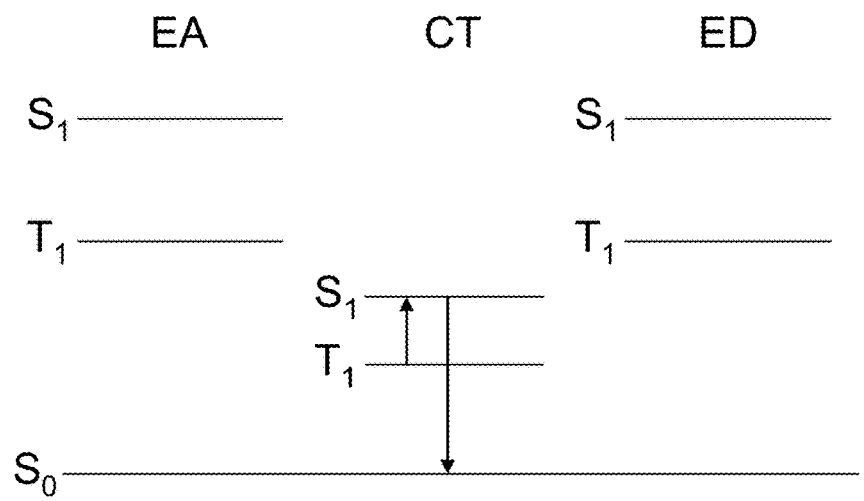
FIG. 3 illustrates lowest singlet excited states ($S_1$) and lowest triplet excited states ($T_1$) of an electron-accepting unit EA, an electron-donating unit ED and a charge-transfer state CT of a TADF unit.

FIG. 3, which is not drawn to any scale, schematically illustrates lowest singlet excited states ($S_1$) and lowest triplet excited states ($T_1$) of the electron-accepting unit EA, the electron-donating unit ED and the charge-transfer state CT.

$S_1CT$ is smaller than that of $S_1EA$ or $S_1ED$.
$T_1CT$ is smaller than that of $T_1EA$ or $T_1ED$.
$S_1CT$ is smaller than either $T_1EA$ or $T_1ED$, preferably by at least 100 meV or by at least 200 meV, optionally by up to 350 meV.

Preferably, the $S_1$-$T_1$ gap of the charge-transfer state is no more than 300 meV, preferably no more than about 250 meV. In operation, excitons formed on $T_1CT$ may be thermally excited to $S_1CT$ due to the small $S_1$-$T_1$ gap, and these excitons may decay to produce delayed fluorescence.

The $S_1$ and $T_1$ energy levels of the electron-donating unit and electron-accepting unit if FIG. 3 are shown as being roughly the same, however it will be understood that the S and/or $T_1$ levels of these units may differ.

An electron-accepting unit and an electron-donating unit suitable for forming a charge transfer state as described herein may be selected according to their known LUMO and HOMO levels respectively, for example as described in Organic Light-Emitting Materials and Devices, Ed. Zhigang Li and Hong Meng, CRC Press, 2007 and Shirota and Kageyama, Chem. Rev. 2007, 107, 953-1010, the contents of which are incorporated herein by reference. Eg CT of a charge-transfer state formed from an electron-accepting unit and an electron-donating unit may be estimated by computer modelling, for example using Gaussian09 software available from Gaussian, Inc. For any given target light-emitting repeat unit having a target $S_1$ energy level (for example, a red, green or blue light-emitting repeat unit), the electron-accepting unit and the electron-donating unit may each be selected from units having a higher $T_1$ than the target $S_1$ energy level.

Polymer Formation

The light-emitting polymer described herein comprises a TADF repeat unit comprising formula ED-EA wherein ED is an electron-donating unit and EA is an electron-accepting unit.

In one embodiment, an electron-accepting monomer and an electron-donating monomer are polymerised to form a polymer comprising an "intermonomer" TADF repeating unit. Suitable polymerisation methods are Suzuki polymerisation and Buchwald polymerisation. Suzuki polymerisation is described in WO 00/53656 and references therein, the contents of which are incorporated herein by reference. Buchwald polymerisation is described in WO 2014/083342 and references therein, the contents of which are incorporated herein by reference.

Scheme 1 illustrates a process for forming a polymer according to this embodiment.

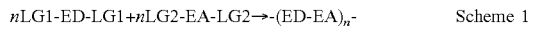
$n$LG1-ED-LG1+$n$LG2-EA-LG2→-(ED-EA)$_n$-      Scheme 1

An electron-donating monomer for forming an electron-donating unit ED and an electron-accepting monomer for forming an electron-accepting unit EA are polymerised to form a TADF repeating unit of formula ED-EA.

LG1 and LG2 are leaving groups. Preferably, monomers with leaving group LG1 do not react with each other, and monomers with leaving group LG2 do not react with each other.

In the case of a Buchwald-type polymerisation ED is an amine electron-donating group, optionally a group of formula (V) illustrated below, and each LG1 is H bound to a N atom of the amine electron-donating group; and each LG2 is independently a halogen, preferably bromine or iodine bound to an aromatic carbon atom of an aryl or heteroaryl group of EA. The monomers are polymerised to form a C—N bond between ED and EA.

In the case of a Suzuki-type polymerisation, one of LG1 and LG2 is as boronic acid or boronic ester group and the other of LG1 and LG2 is halogen, sulfonic acid or sulfonic ester. Each of LG1 and LG2 is bound to a carbon atom of an aryl or heteroaryl group of a monomer and the monomers are polymerised to form a carbon-carbon bond between the aryl or heteroaryl groups of the monomers.

Preferably, one of LG1 and LG2 is bromine or iodine and the other is a boronic acid or boronic ester.

Exemplary boronic esters have formula (VI):

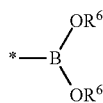
(VI)

wherein $R^6$ in each occurrence is independently a $C_{1-20}$ alkyl group, * represents the point of attachment of the boronic ester to an aromatic ring of the monomer, and the two groups $R^6$ may be linked to form a ring. In a preferred embodiment, the two groups $R^6$ are linked to form the pinacol ester of boronic acid:

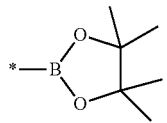

It will be understood by the skilled person that a monomer containing LG1 leaving groups only will not polymerise to form a direct carbon-carbon bond with another monomer containing LG1 leaving groups, and a monomer containing LG2 leaving groups only will not polymerise to form a direct carbon-carbon bond with another monomer containing LG2 leaving groups.

The repeating units of the polymer may consist of alternating ED and EA groups, or may contain one or more further repeat units. Scheme 2a illustrates a polymerisation in which a further repeat unit X is used:

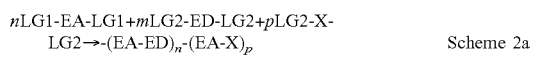
$n$LG1-EA-LG1+$m$LG2-ED-LG2+$p$LG2-X-LG2→-(EA-ED)$_n$-(EA-X)$_p$      Scheme 2a wherein n>m and n>p. Optionally, n is 50 mol % and n+p is 50 mol % of the monomers of the polymerisation mixture.

The polymer of Scheme 2 contains TADF repeating units of formula ED-EA and repeating units of formula EA-X. The repeating units of ED-EA and EA-X may be randomly distributed or may be formed in blocks. Scheme 2b illustrates a block polymerisation used to ensure that no oligomeric emitting units are formed and that the emitting units are spaced form each other.

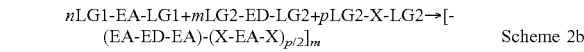
$n$LG1-EA-LG1+$m$LG2-ED-LG2+$p$LG2-X-LG2→[-(EA-ED-EA)-(X-EA-X)$_{p/2}$]$_m$      Scheme 2b When further repeat units are used, the formation of blocks may be used so the emitting units are spaced from each other and that the emitting unit stays the same in the polymer. Scheme 3 illustrates a block polymerisation in which a further repeat unit Y is used:

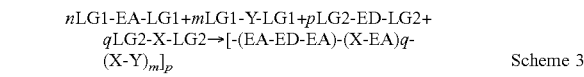
$n$LG1-EA-LG1+$m$LG1-Y-LG1+$p$LG2-ED-LG2+ $q$LG2-X-LG2→[-(EA-ED-EA)-(X-EA)$q$-(X-Y)$_m$]$_p$      Scheme 3 wherein n+m is 50 mol % and p+q is 50 mol % of the monomers of the polymerisation mixture.

Blocks may be formed by the order and the proportions of monomers.

The molar percentage of monomers for forming electron-donating groups is greater than the molar percentage of monomers for forming electron-accepting groups in the polymerisation illustrated in Scheme 2. It will be appreciated that the molar percentage of monomers for forming electron-accepting groups may be greater than the molar percentage of monomers for forming electron-donating groups.

If one of the electron-accepting units and electron donating units is provided in a greater molar amount than the other of the electron-accepting units and electron donating units then electron-accepting or electron-donating units not forming part of the TADF emitter may provide electron-transport or hole-transport, respectively. Efficient charge transport may be achieved by using an electron-transporting unit or hole-transporting unit that is the same as the electron-accepting or electron-donating unit of the TADF emitter.

An excess of electron-accepting units or an excess of electron-donating units may be used to control the recombination zone of the polymer.

The TADF repeating units comprises the group ED-EA. The TADF repeating unit may consist of the group ED-EA, or may comprise one or more further groups selected from ED and EA. The TADF repeating unit may have one of the following formulae:

-EA-ED-EA-

-ED-EA-ED-

In the polymerisation of Scheme 2 only one further monomer is provided in addition to the monomers for forming units EA and ED, however it will be appreciated that one, two or more further monomers may be provided.

Preferably, the further monomers are arylene monomers, each of which may be unsubstituted or substituted with one or more substituents.

Polymerisation of an electron-donating monomer and an electron-accepting monomer results in formation of a TADF unit in which both the electron-donating and electron-accepting units are in the polymer backbone, with the transition dipole moment of the TADF unit aligned with the polymer chain. The present inventors have found that this alignment can provide higher efficiency. Preferably, the polymer has a high degree of anisotropy. A highly anisotropic polymer may which may align with the substrate and enhance the improvement in efficiency arising from alignment of the transition dipole moment with the polymer backbone. Preferably, the light-emitting polymer has an anisotropy factor α of no more than 0.8 as measured by ellipsometry, optionally no more than 0.7, optionally no more than 0.6, optionally no more than 0.5, optionally no more than 0.4. Anisotropy factor α as described herein is measured as described in M. Flammich, J. Frischeisen, D. S. Setz, D. Michaelis, B. C. Krummacher, T. D. Schmidt, W. Briitting, N. Danz, Org. Electron. 2011, 12, 1663. The average dipole orientation can be represented by a vector (x,y,z) where the z direction is normal to the plane of the thin film. This can be further parameterised as the ratio of parallel to perpendicular components $p_\|:p_\perp=(x+y):z$ as used in Flammich et al, or alternatively as an anisotropy factor $\alpha=z/x=z/y$, as used throughout this document. In this way, isotropic orientation can be represented by (1,1,1), where $p_\|:p_\perp=2:1$ and α=1. Additionally, an example of a anisotropic orientation can be represented as (0.3571, 0.3571, 0.2858), where $p_\|:p_\perp=2.5:1$ and α=0.8.

In the embodiments of FIGS. 1 and 2 an electron-donating fragment ED and an electron-accepting fragment EA are joined to form a repeat unit comprising formula ED-EA.

In other embodiments, the fragments to form ED-EA may be selected such that one fragment contains ED and part of EA and the other fragment contains a remaining part of EA, or such that one fragment contains EA and part of ED and the other fragment contains a remaining part of ED.

In another embodiment, the TADF unit ED-EA may be provided as a complete group of a monomer.

The polymer backbone may be endcapped. Endcapping units may be added after, during or at the outset of polymerisation.

Electron-Accepting Units

An electron-accepting component of the light-emitting repeat unit may be a heteroaryl group Het, wherein Het is a 5-20-membered fused or monocyclic heteroaryl group comprising at least one N atom, preferably a heteroaryl group of C and N atoms and, optionally, O or S atoms. Exemplary groups Het are triazine, preferably 1,3,5-triazine; oxadiazole; pyridazine; pyrimidine; pyrazine; pyridine; triazole; and heptazine.

Preferably, Het is 1,3,5-triazine.

Substituents of Het, if present, may be selected from substituents $R^2$ wherein each $R^2$ is independently selected from the group consisting of:

alkyl, optionally $C_{1-20}$ alkyl, wherein one or more non-adjacent C atoms may be replaced with optionally substituted aryl or heteroaryl, O, S, C=O or —COO—, and one or more H atoms may be replaced with F; and aryl and heteroaryl groups that may be unsubstituted or substituted with one or more substituents, preferably phenyl substituted with one or more $C_{1-20}$ alkyl groups.

Preferably $R^2$, if present, is an unsubstituted or substituted phenyl group.

An electron-accepting component of a light-emitting repeat unit may have formula (I):

$$—(Ar^1—Het-Ar^1)— \quad (I)$$

wherein $Ar^1$ in each occurrence is independently an aryl group, Het is a heteroaryl group as described above, and $Ar^1$ and Het may each independently be unsubstituted or substituted with one or more substituents.

Preferably, $Ar^1$ is a $C_{6-20}$ aryl group, more preferably phenyl.

Substitutents of $Ar^1$, if present, may be selected from substituents $R^1$ wherein each $R^1$ is independently selected from the group consisting of:

alkyl, optionally $C_{1-20}$ alkyl, wherein one or more non-adjacent C atoms may be replaced with optionally substituted aryl or heteroaryl, O, S, C=O or —COO—, and one or more H atoms may be replaced with F; and aryl and heteroaryl groups that may be unsubstituted or substituted with one or more substituents, preferably phenyl substituted with one or more $C_{1-20}$ alkyl groups.

Preferably $R^1$, if present, is a $C_{1-20}$ alkyl group.

A preferred group of formula (I) has formula (Ia):

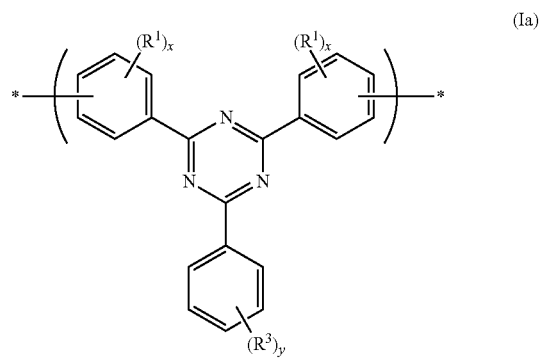

(Ia)

wherein $R^1$ is as described above; each x is independently 0, 1, 2, 3 or 4; $R^3$ is a substituent; and y is 0, 1, 2, 3, 4 or 5, preferably 1 or 2.

Preferably $R^3$, if present, is $C_{1-20}$ alkyl wherein one or more non-adjacent C atoms may be replaced with optionally substituted aryl or heteroaryl, O, S, C=O or —COO—, and one or more H atoms may be replaced with F.

Optionally, the phenylene units binding the repeat unit of formula (Ia) to adjacent repeat units are meta-linked or para-linked.

The electron-accepting component of the light-emitting repeat unit may be a 1,2-, 1,3- or 1,4-linked phenylene group substituted with one or more electron withdrawing groups. Exemplary electron-withdrawing groups include fluorine, $C_{1-10}$ fluoroalkyl, preferably $C_{1-10}$ perfluoroalkyl, and cyano.

The electron-accepting component of the light-emitting repeat unit may be diphenylsulfone that may be unsubstituted or substituted with one or more substituents, optionally one or more substituents $R^1$ as described above.

The electron-accepting component of the light-emitting repeat unit may be fluorenone that may be unsubstituted or substituted with one or more substituents, optionally one or more substituents $R^1$ as described above.

Further electron-accepting units may be selected from electron-transporting groups described in Shirota and Kageyama, Chem. Rev. 2007, 107, 953-1010 the contents of which are incorporated herein by reference.

Electron-Donating Units

An electron-donating component of a light-emitting repeat unit may have formula (V):

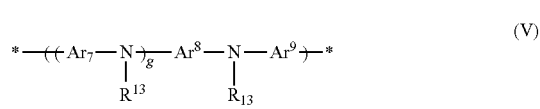

(V)

wherein $Ar^7$, $Ar^8$ and $Ar^9$ in each occurrence are independently selected from substituted or unsubstituted aryl or heteroaryl; g is 0 or a positive integer, preferably 0 or 1; and each $R^{13}$ independently is a substituent.

$R^{13}$, which may be the same or different when g is a positive integer, is preferably selected from the group consisting of alkyl, optionally $C_{1-20}$ alkyl, $Ar^{10}$, or a branched or linear chain of $Ar^{10}$ groups, wherein $Ar^{10}$ in each occurrence is independently optionally substituted aryl or heteroaryl, preferably a $C_{6-20}$ aryl group. Exemplary groups $R^{13}$ are $C_{1-20}$ alkyl and $C_{6-20}$ aryl that may be unsubstituted or substituted with one or more substituents. Exemplary $C_{6-20}$ aryl groups are phenyl and fluorene that may be unsubstituted or substituted with one or more $C_{1-20}$ alkyl groups.

Any of $Ar^7$, $Ar^8$, $Ar^9$ and, if present, $Ar^{10}$ bound directly to the N atom in the repeat unit of formula (V) may be linked by a direct bond or a divalent linking atom or group to another of $Ar^7$, $Ar^8$, $Ar^9$ and $Ar^{10}$ bound directly to the same N atom. Preferred divalent linking atoms and groups include O, S; substituted N; and substituted C.

Any of $Ar^7$, $Ar^8$, $Ar^9$ and, if present, $Ar^{10}$ may be substituted with one or more substituents. Exemplary substituents are substituents $R^{14}$, wherein each $R^{14}$ may independently be selected from the group consisting of substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F.

Substituted N or substituted C, where present, may be N or C substituted with a hydrocarbyl group (in the case of substituted N) or two hydrocarbyl groups (in the case of substituted C), for example a $C_{1-10}$ alkyl, unsubstituted phenyl or phenyl substituted with one or more $C_{1-10}$ alkyl groups.

Preferred repeat units of formula (V) are selected from sub-formulae 1, 2 and 3:

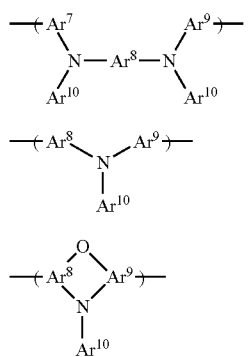

$Ar^7$, $Ar^8$ and $Ar^9$ of formulae 1, 2 and 3 are preferably phenyl, each of which may independently be substituted with one or more substituents as described above.

Electron-donating units of formula (V) may be formed by Suzuki polymerisation to form a C—C bond between an aryl or heteroaryl group of formula (V) and an electron-accepting unit.

The electron-donating unit may have formula (VI):

(VI)

wherein $Ar^8$, $R^{13}$ and g are as described with reference to formula (V).

Electron-donating units of formula (VI) may be formed by Buchwald polymerisation to form a C—N bond between an N atom of formula (VI) and a carbon atom of an electron-accepting unit.

Further electron-donating units may be selected from hole-transporting groups described in Shirota and Kageyama, Chem. Rev. 2007, 107, 953-1010 the contents of which are incorporated herein by reference.

Further Units

The backbone of light-emitting polymer may consist only of EA and ED units, for example a polymer backbone of alternating EA and ED units, or may contain one or more further repeat units.

Further repeat units, if present in addition to units EA and ED, include without limitation arylene repeat units and conjugation-breaking repeat units that break conjugation along the polymer backbone.

Exemplary arylene repeat units include 1,2-, 1,3- and 1,4-phenylene repeat units, 3,6- and 2,7-linked fluorene repeat units, indenofluorene, 1,4-linked naphthalene; 2,6-linked naphthalene, 9,10-linked anthracene; 2,6-linked anthracene; phenanthrene, for example 2,7-linked phenanthrene repeat units, each of which may be unsubstituted or substituted with one or more substitutents, for example one or more $C_{1-40}$ hydrocarbyl substituents.

Substituents may be provided on the one or more further repeat units for solubility of the polymer, to control viscosity of solutions of the polymer and/or to prevent aggregation of the polymer. For example, $C_{1-20}$ alkyl substituents may be provided for solubility in non-polar solvents such as alkylated benzenes.

Substituents may be provided adjacent to one or both linking positions of an arylene co-repeat unit to create steric hindrance with adjacent repeat units, resulting in twisting of the arylene co-repeat unit out of the plane of the adjacent repeat unit, limiting the extent of conjugation across the repeat unit. This limited conjugation may limit the extent of conjugation of the light-emitting repeat unit to adjacent co-repeat units.

Further repeat units preferably have a higher $T_1$ than $T_1CT$.

One preferred class of arylene repeat units is phenylene repeat units, such as phenylene repeat units of formula (VI):

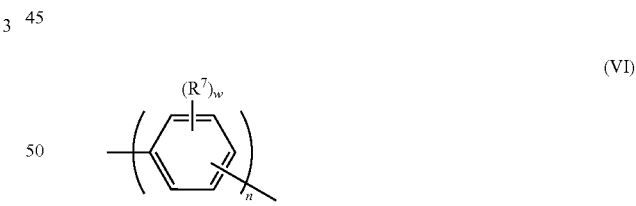

(VI)

wherein w in each occurrence is independently 0, 1, 2, 3 or 4, optionally 1 or 2; n is 1, 2 or 3; and $R^7$ independently in each occurrence is a substituent.

Each $R^7$ may independently be selected from the group consisting of:
  alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
  aryl and heteroaryl groups that may be unsubstituted or substituted with one or more substituents, preferably phenyl substituted with one or more $C_{1-20}$ alkyl groups; and a linear or branched chain of aryl or heteroaryl groups, each of which groups may independently be substituted, for example a group of formula —(Ar$^7$)$_r$ wherein each Ar$^7$ is independently an aryl or heteroaryl group and r is at least 2, preferably a branched or linear chain of phenyl groups each of which may be unsubstituted or substituted with one or more C$_{1-20}$ alkyl groups.

In the case where R$^7$ comprises an aryl or heteroaryl group, or a linear or branched chain of aryl or heteroaryl groups, the or each aryl or heteroaryl group may be substituted with one or more substituents R$^8$ selected from the group consisting of:

alkyl, for example C$_{1-20}$ alkyl, wherein one or more non-adjacent C atoms may be replaced with O, S, substituted N, C=O and —COO— and one or more H atoms of the alkyl group may be replaced with F; NR$^9_2$, OR$^9$, SR$^9$, SiR$^9_3$ and fluorine, nitro and cyano;

wherein each R$^9$ is independently selected from the group consisting of alkyl, preferably C$_{1-20}$ alkyl; and aryl or heteroaryl, preferably phenyl, optionally substituted with one or more C$_{1-20}$ alkyl groups.

Substituted N, where present, may be —NR$^{17}$— wherein R$^{17}$ is a substituent and is optionally in each occurrence a C$_{1-40}$ hydrocarbyl group, optionally a C$_{1-20}$ alkyl group.

Preferably, each R$^7$, where present, is independently selected from C$_{1-40}$ hydrocarbyl, and is more preferably selected from C$_{1-20}$ alkyl; unsubstituted phenyl; phenyl substituted with one or more C$_{1-20}$ alkyl groups; a linear or branched chain of phenyl groups, wherein each phenyl may be unsubstituted or substituted with one or more substituents; and a crosslinkable group.

If n is 1 then exemplary repeat units of formula (VI) include the following:

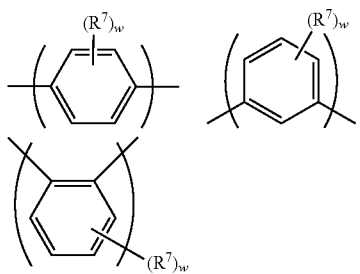

A particularly preferred repeat unit of formula (VI) has formula (VIa):

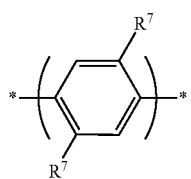

(VIa)

Substituents R$^7$ of formula (VIa) are adjacent to linking positions of the repeat unit, which may cause steric hindrance between the repeat unit of formula (VIa) and adjacent repeat units, resulting in the repeat unit of formula (VIa) twisting out of plane relative to one or both adjacent repeat units, thereby limiting conjugation across the repeat unit.

Exemplary repeat units where n is 2 or 3 include the following:

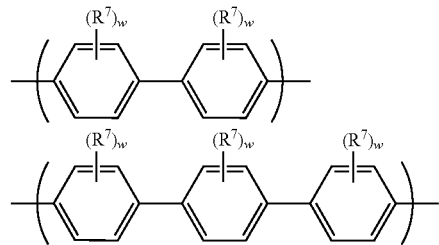

A preferred repeat unit has formula (VIb):

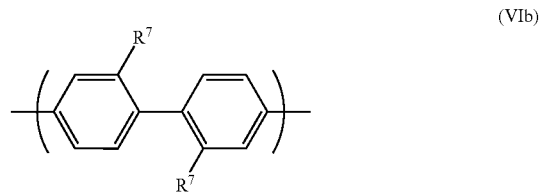

(VIb)

The two R$^7$ groups of formula (VIb) may cause steric hindrance between the phenyl rings they are bound to, resulting in twisting of the two phenyl rings relative to one another.

A further class of arylene repeat units is optionally substituted fluorene repeat units, such as repeat units of formula (VII):

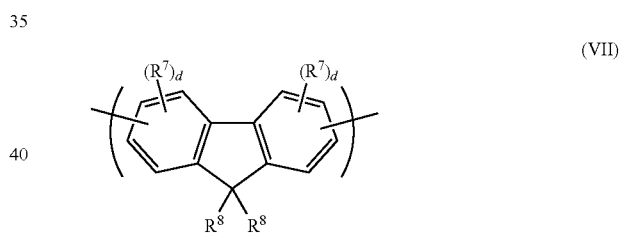

(VII)

wherein R$^8$ in each occurrence is the same or different and is a substituent wherein the two groups R$^8$ may be linked to form a ring; R$^7$ is a substituent as described above; and d is 0, 1, 2 or 3.

Each R$^8$ may independently be selected from the group consisting of:

alkyl, optionally C$_{1-20}$ alkyl, wherein one or more non-adjacent C atoms may be replaced with optionally substituted aryl or heteroaryl, O, S, substituted N, C=O or —COO—, and one or more H atoms may be replaced with F;

aryl and heteroaryl groups that may be unsubstituted or substituted with one or more substituents, preferably phenyl substituted with one or more C$_{1-20}$ alkyl groups; and a linear or branched chain of aryl or heteroaryl groups, each of which groups may independently be substituted, for example a group of formula —(Ar$^7$)$_r$ wherein each Ar$^7$ is independently an aryl or heteroaryl group and r is at least 2, optionally 2 or 3, preferably a branched or linear chain of phenyl groups each of which may be unsubstituted or substituted with one or more C$_{1-20}$ alkyl groups.

Preferably, each $R^8$ is independently a $C_{1-40}$ hydrocarbyl group.

Substituted N, where present, may be —$NR^{17}$— wherein $R^{17}$ is as described above.

The aromatic carbon atoms of the fluorene repeat unit may be unsubstituted, or may be substituted with one or more substituents $R^7$ as described with reference to Formula (VI).

Exemplary substituents $R^7$ are alkyl, for example $C_{1-20}$ alkyl, wherein one or more non-adjacent C atoms may be replaced with O, S, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

The extent of conjugation of repeat units of formula (VII) to aryl or heteroaryl groups of adjacent repeat units in the polymer backbone may be controlled by (a) linking the repeat unit through the 3- and/or 6-positions to limit the extent of conjugation across the repeat unit, and/or (b) substituting the repeat unit with one or more substituents $R^8$ in or more positions adjacent to the linking positions in order to create a twist with the adjacent repeat unit or units, for example a 2,7-linked fluorene carrying a $C_{1-20}$ alkyl substituent in one or both of the 3- and 6-positions.

The repeat unit of formula (VII) may be a 2,7-linked repeat unit of formula (VIIa):

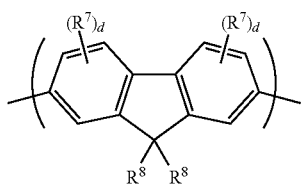

(VIIa)

A relatively high degree of conjugation across the repeat unit of formula (VIIa) may be provided in the case where each d=0, or where any substituent R7 is not present at a position adjacent to the linking 2- or 7-positions of formula (VIIa).

A relatively low degree of conjugation across the repeat unit of formula (VIIa) may be provided in the case where at least one d is at least 1, and where at least one substituent $R^7$ is present at a position adjacent to the linking 2- or 7-positions of formula (VIIa). Optionally, each d is 1 and the 3- and/or 6-position of the repeat unit of formula (VIIa) is substituted with a substituent $R^7$ to provide a relatively low degree of conjugation across the repeat unit.

The repeat unit of formula (VII) may be a 3,6-linked repeat unit of formula (VIIb)

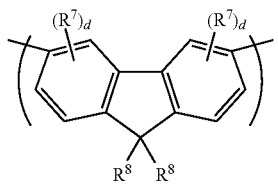

(VIIb)

The extent of conjugation across a repeat unit of formula (VIIb) may be relatively low as compared to a corresponding repeat unit of formula (VIIa).

Another exemplary arylene repeat unit has formula (VIII):

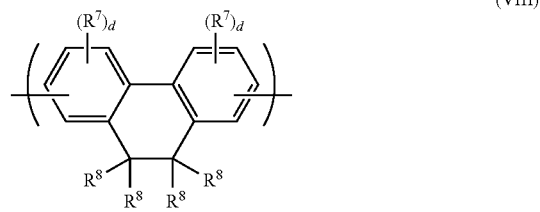

(VIII)

wherein $R^7$, $R^8$ and d are as described with reference to formula (VI) and (VII) above. Any of the $R^7$ groups may be linked to any other of the $R^7$ groups to form a ring. The ring so formed may be unsubstituted or may be substituted with one or more substituents, optionally one or more $C_{1-20}$ alkyl groups.

Repeat units of formula (VIII) may have formula (VIIIa) or (VIIIb):

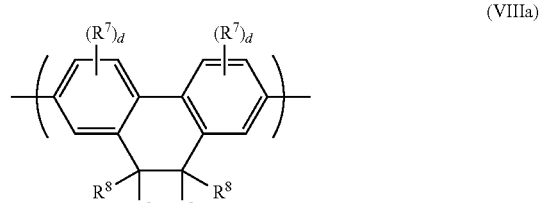

(VIIIa)

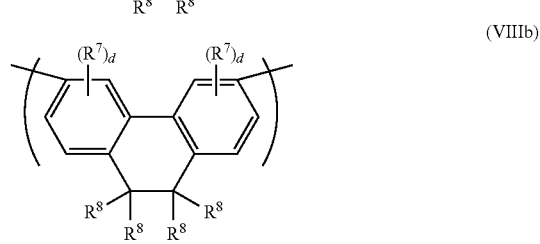

(VIIIb)

The one or more further repeat units may include a conjugation-breaking repeat unit, which is a repeat unit that does not provide any conjugation path between repeat units adjacent to the conjugation-breaking repeat unit.

Preferably, the arylene group is linked such that an angle θ between the two bonds of the repeat unit to adjacent repeat units is as small as possible, for example as in 1,4-linked phenylene repeat units such as repeat units of formula (VIa); 2,7-linked fluorene repeat units such as repeat units of formula (VIIa); and 2-8-linked phenanthrene or dihydrophenanthrene repeat units such as repeat units of formula (VIIIa).

Exemplary conjugation-breaking repeat units include co-repeat units of formula (XVI):

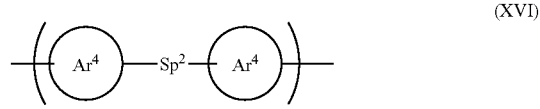

(XVI)

wherein:

$Ar^4$ in each occurrence independently represents an aryl or heteroaryl group that may be unsubstituted or substituted with one or more substituents; and Sp$^2$ represents a spacer group comprising at least one carbon or silicon atom.

Preferably, the spacer group Sp$^2$ includes at least one sp$^3$-hybridised carbon atom separating the Ar$^4$ groups.

Preferably Ar$^4$ is an aryl group and the Ar$^4$ groups may be the same or different. More preferably each Ar$^4$ is phenyl.

Each Ar$^4$ may independently be unsubstituted or may be substituted with 1, 2, 3 or 4 substituents. The one or more substituents may be selected from:

C$_{1-20}$ alkyl wherein one or more non-adjacent C atoms of the alkyl group may be replaced by O, S or COO, C=O, NR$^{17}$ or SiR$^{17}_2$, and one or more H atoms of the C$_{1-20}$ alkyl group may be replaced by F wherein R$^{17}$ is a substituent and is optionally in each occurrence a C$_{1-40}$ hydrocarbyl group, optionally a C$_{1-20}$ alkyl group; and aryl or heteroaryl, optionally phenyl, that may be unsubstituted or substituted with one or more C$_{1-20}$ alkyl groups.

Preferred substituents of Ar$^4$ are C$_{1-20}$ alkyl groups, which may be the same or different in each occurrence.

Exemplary groups Sp$^2$ include a C$_{1-20}$ alkyl chain wherein one or more non-adjacent C atoms of the chain may be replaced with O, S, —NR$^{17}$—, —SiR$^{17}_2$—, —C(=O)— or —COO— and wherein R$^{17}$ in each occurrence is a substituent and is optionally in each occurrence a C$_{1-40}$ hydrocarbyl group, optionally a C$_{1-20}$ alkyl group, with the proviso that Sp2 contains at least one sp$^3$-hybridised carbon atom spacing the two Ar4 groups apart.

Exemplary repeat units of formula (XVI) include the following, wherein R in each occurrence is H or C$_{1-5}$ alkyl:

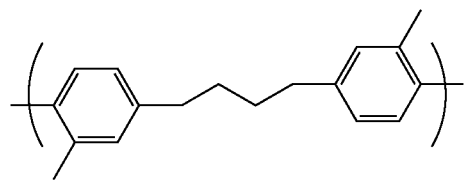

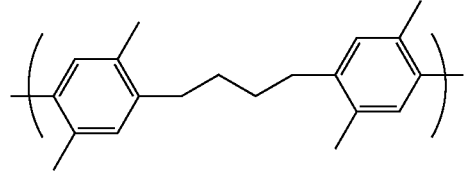

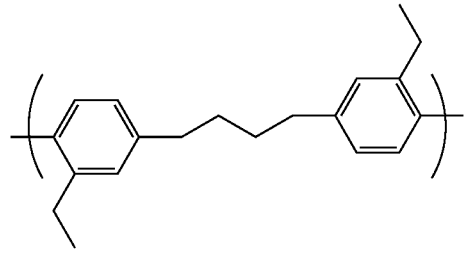

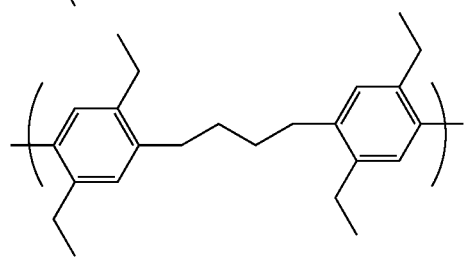

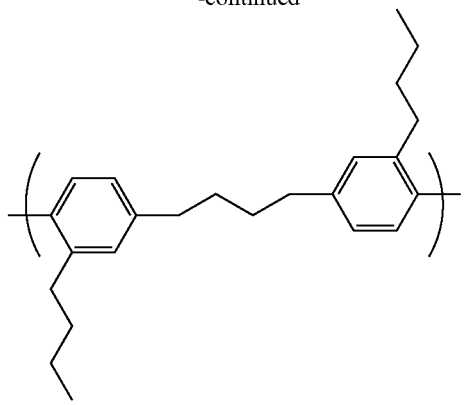

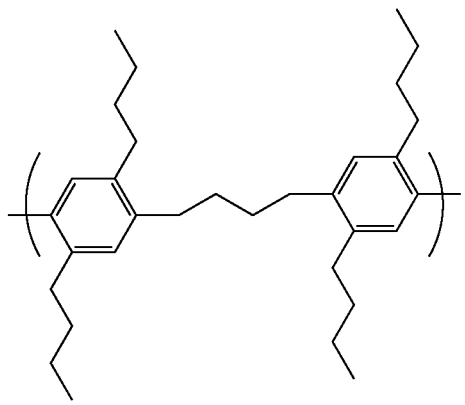

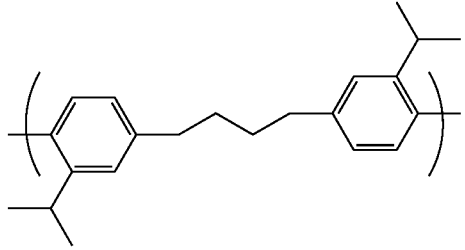

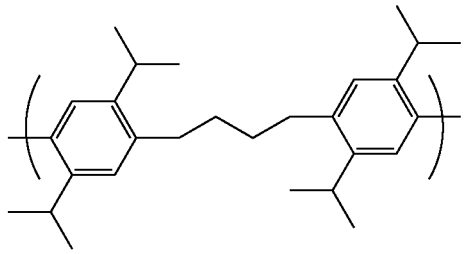

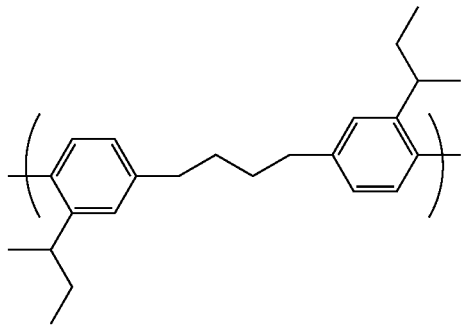

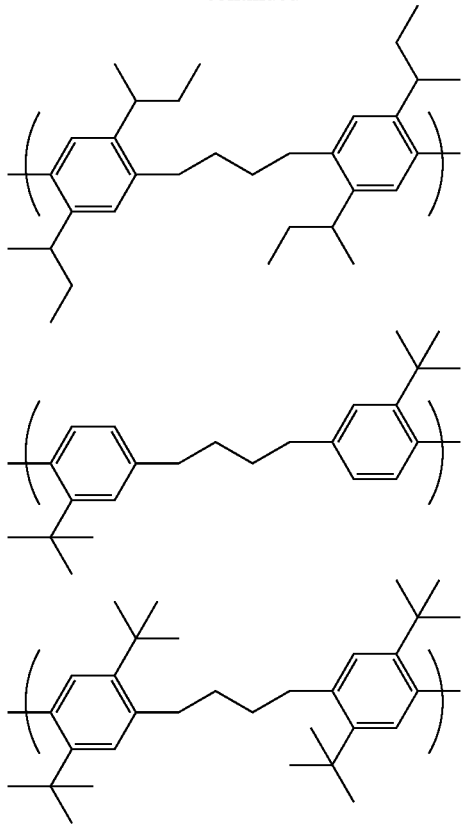

Preferably, light-emitting repeat units form 1-50 mol %, optionally 1-10 mol % of the repeat units of the polymer.

Preferably, repeat units of formula EA or ED that do not form part of the light-emitting repeat units, if present, form 1-50 mol % of the repeat units of the polymer.

Preferably, further repeat units form 1-50 mol % of the repeat units of the polymer.

Solution Processing

A light-emitting layer comprising a light-emitting polymer as described herein may be formed by depositing the light-emitting polymer from a solution of the polymer and, if present, any other components of the light-emitting layer, dissolved in a solvent or solvent mixture.

Exemplary solvents are benzenes substituted with one or more substituents selected from $C_{1-10}$ alkyl, $C_{1-10}$ alkoxy and chlorine, for example toluene, xylenes and methylanisoles.

Exemplary solution deposition techniques including printing and coating techniques such spin-coating, dip-coating, flexographic printing, inkjet printing, slot-die coating and screen printing. Spin-coating and inkjet printing are particularly preferred.

Spin-coating is particularly suitable for devices wherein patterning of the light-emitting layer is unnecessary—for example for lighting applications or simple monochrome segmented displays.

Inkjet printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device).

The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Preferably, the light-emitting layer is heated following deposition. Optionally, the polymer is heated to a temperature below its glass transition temperature.

Additional layers between the anode and cathode of an OLED, where present, may be formed by a solution deposition method as described herein.

Hole Injection Layers

A conductive hole injection layer, which may be formed from a conductive organic or inorganic material, may be provided between the anode and the light-emitting layer or layers of an OLED to improve hole injection from the anode into the layer or layers of semiconducting polymer. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Where a hole-transporting layer is present, a hole-injection layer may be provided between the anode and the hole-transporting layer.

Charge Transporting and Charge Blocking Layers

A hole transporting layer may be provided between the anode and the light-emitting layer or layers. An electron transporting layer may be provided between the cathode and the light-emitting layer or layers.

An electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

A hole transporting layer preferably has a HOMO level of less than or equal to 5.5 eV, more preferably around 4.8-5.5 eV as measured by cyclic voltammetry. The HOMO level of the hole transport layer may be selected so as to be within 0.2 eV, optionally within 0.1 eV, of an adjacent layer (such as a light-emitting layer) in order to provide a small barrier to hole transport between these layers. The hole-transporting layer may be a polymer comprising repeat units of formula (I) as described above.

An electron transporting layer located between the light-emitting layers and cathode preferably has a LUMO level of around 2.5-3.5 eV as measured by cyclic voltammetry. For example, a layer of a silicon monoxide or silicon dioxide or other thin dielectric layer having thickness in the range of 0.2-2 nm may be provided between the light-emitting layer nearest the cathode and the cathode. HOMO and LUMO levels may be measured using cyclic voltammetry.

An electron transporting layer may contain a polymer comprising a chain of optionally substituted arylene repeat units, such as a chain of fluorene repeat units.

A hole-transporting material of a hole-transporting layer or an electron-transporting material of an electron-transporting layer that is adjacent to the light-emitting layer preferably has a lowest triplet excited state energy level that is higher than $T_1CT$, and more preferably higher than $T_1EA$ or $T_1ED$, to prevent quenching of triplet excitons.

Cathode

The cathode is selected from materials that have a workfunction allowing injection of electrons into the light-emitting layer. Other factors influence the selection of the cathode such as the possibility of adverse interactions between the cathode and the light-emitting material. The cathode may consist of a single material such as a layer of aluminium. Alternatively, it may comprise a plurality of conductive materials, for example a plurality of conductive metals such a bilayer of a low workfunction material and a high workfunction material such as calcium and aluminium as disclosed in WO 98/10621. The cathode may comprise a layer of elemental barium, for example as disclosed in WO 98/57381, Appl. Phys. Lett. 2002, 81(4), 634 and WO 02/84759. The cathode may comprise a thin (e.g. 1-5 nm) layer of metal compound between the organic semiconducting layers and one or more conductive cathode layers, in particular an oxide or fluoride of an alkali or alkali earth metal, to assist electron injection, for example lithium fluoride, for example as disclosed in WO 00/48258; barium fluoride, for example as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Measurements

HOMO, LUMO, $S_1$ and $T_1$ values of a polymer containing a light-emitting unit comprising ED-EA as described herein may be measured from a polymer containing the light-emitting unit.

HOMO, LUMO, $S_1$ and $T_1$ values of an electron-accepting unit (EA) or an electron-donating unit (ED) as described herein may, respectively, be measured from the same polymer but without the electron donating unit present and from the same polymer without the electron accepting unit present.

HOMO and LUMO values as described anywhere herein are as measured by square wave cyclic voltammetry by ramping a working electrode potential linearly versus time. When square wave voltammetry reaches a set potential the working electrode's potential ramp is inverted. This inversion can happen multiple times during a single experiment. The current at the working electrode is plotted versus the applied voltage to give the cyclic voltammogram trace.

Apparatus to measure HOMO or LUMO energy levels by CV may comprise a cell containing a tert-butyl ammonium perchlorate/or tertbutyl ammonium hexafluorophosphate solution in acetonitrile, a glassy carbon working electrode where the sample is coated as a film, a platinum counter electrode (donor or acceptor of electrons) and a reference glass electrode no leak Ag/AgCl. Ferrocene is added in the cell at the end of the experiment for calculation purposes.

Measurement of the difference of potential between Ag/AgCl/ferrocene and sample/ferrocene.

Method and Settings:

3 mm diameter glassy carbon working electrode

Ag/AgCl/no leak reference electrode

Pt wire auxiliary electrode 0.1 M tetrabutylammonium hexafluorophosphate in acetonitrile LUMO=4.8–ferrocene (peak to peak maximum average)+onset Sample: 1 drop of 5 mg/mL in toluene spun at 3000 rpm LUMO (reduction) measurement: A good reversible reduction event is typically observed for thick films measured at 200 mV/s and a switching potential of −2.5V. The reduction events should be measured and compared over 10 cycles, usually measurements are taken on the $3^{rd}$ cycle. The onset is taken at the intersection of lines of best fit at the steepest part of the reduction event and the baseline. HOMO and LUMO values may be measured at ambient temperature.

Bandgaps Eg as given anywhere herein are the HOMO and LUMO band gaps as measured by square wave cyclic voltammetry.

$S_1$ and $T_1$ values of the charge-transfer state may be measured by photoluminescence spectroscopy of an 80 nm thick film of the light-emitting polymer onto a quartz substrate and measuring in a nitrogen environment using apparatus C9920-02 supplied by Hamamatsu.

$S_1$ values as described herein may be obtained from the room temperature fluorescence spectrum of the polymer.

$T_1$ values as described herein may be measured from the energy onset of the phosphorescence spectrum measured by low temperature phosphorescence spectroscopy (Y. V. Romaovskii et al, Physical Review Letters, 2000, 85 (5), p 1027, A. van Dijken et al, Journal of the American Chemical Society, 2004, 126, p 7718).

$S_1$ and $T_1$ values are taken from the spectral position of the half maximum of the short-wavelength side of the emission peak.

Film PLQY was measured under excitation at 320 nm using Hamamatsu C9920-02 measurement system. During measurements the sample was kept in an integration sphere under nitrogen gas flow. For transient PL measurements a passively Q-switched diode pumped solid state laser (CryLas) operating with 10 Hz repetition rate was used for PL excitation at 355 nm. Pulse width at the output of 10 m long optical fiber delay line was 5 ns (FWHM), and the pulse energy was ~100 µJ. The PL was dispersed using Acton SP2300 spectrograph and detected using PI-MAX 3 gated ICCD camera (both Princeton Instruments) with the time resolution of 1 ns. To achieve over 10 orders of magnitude resolution in intensity we kept increasing time window from 1 ns to 10 ms with increasing delay to provide sufficient signal to noise ratio and not to compromise the time resolution (time window was typically smaller than the distance between two neighboring delays). During transient PL measurements sample was kept in vacuum in a closed cycle optical cryostat (Optistat AC-V, Oxford instruments). The cryostat was equipped with PT403 pulse tube cryorefrigerator (Cryomech) with temperature controller for temperature dependent PL measurements.

Electroluminescence spectra of OLEDs were measured using Ocean Optics USB2000+spectrometer, and J-V-L characteristics were measured using Minolta CS-200 luminance meter and Keithley 2400 SourceMeter. Values of EQE at few current densities were additionally checked by measurements in an integration sphere. Transient EL was measured using Agilent 8110A pulse generator, cooled photomultiplier (Hamamatsu H7422-01), and Agilent Infiniium DSO80304B Oscilloscope.

EXAMPLES

Polymer Examples

Polymer Examples 1-3 were prepared randomly by Suzuki polymerisation as described in WO 00/53656 using monomers as set out in Table 1.

Polymer example 4 was prepared by Suzuki polymerisation as described in WO 00/53656 using monomers as set out in Table 1. Blocks were formed by starting the polymerisation with Monomer 1 and Monomer 6. After 3.5 hours reaction time Monomer 3 was added and polymerisation was continued for 3.5 hours and end capped.

| Polymer | Diboronic ester monomer (mol %) | Dibromo monomer (mol %) |
|---|---|---|
| Polymer Example 1 | Monomer 1 (47) Monomer 2 (3) | Monomer 5 (50) |
| Polymer Example 2 | Monomer 1 (47) Monomer 3 (3) | Monomer 5 (50) |
| Polymer Example 3 | Monomer 1 (47) Monomer 4 (3) | Monomer 5 (50) |
| Polymer Example 4 | Monomer 1 (45) Monomer 3 (5) | Monomer 6 (50) |
| Polymer Example 5 | Monomer 1 (47) Monomer 3 (3) | Monomer 7 (50) |

-continued

| Polymer | Diboronic ester monomer (mol %) | Dibromo monomer (mol %) |
|---|---|---|

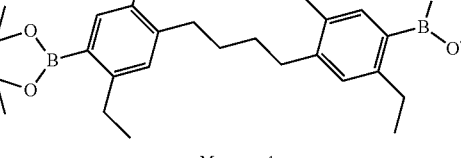

Monomer 1

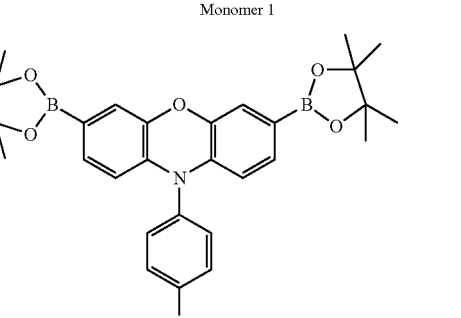

Monomer 2

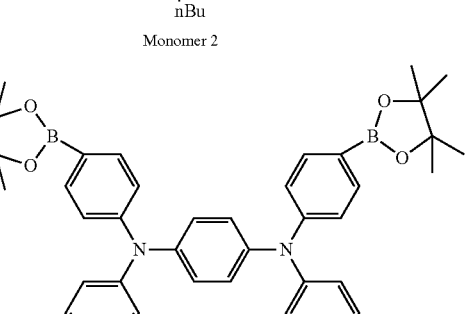

Monomer 3

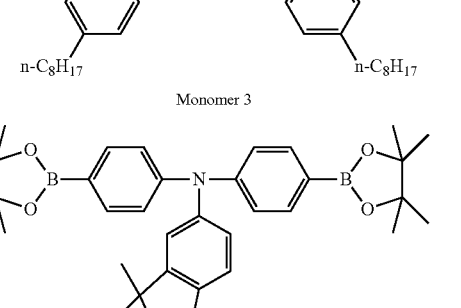

Monomer 4

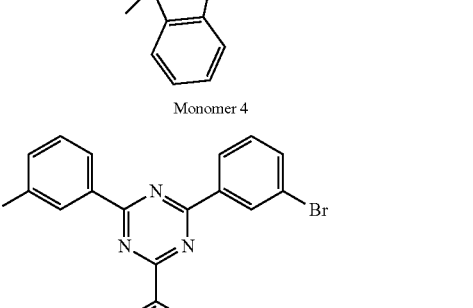

Monomer 5

| Polymer | Diboronic ester monomer (mol %) | Dibromo monomer (mol %) |
|---------|-------------------------------|-----------------------|

Monomer 6

Monomer 7

It will be appreciated that amine units derived from diboronic ester Monomers 2, 3 or 4 will each be adjacent to triphenyl triazine units of derived from Monomer 5, 6 or 7.

Optical Characterisation

An 80 nm thick neat film of Polymer Example 4 was spun on a quartz substrate from xylene solution.

Film photoluminescence quantum yield (PLQY) measured in an integration sphere in a nitrogen atmosphere was 34%. For transient photoluminescence (PL) measurements the sample was kept in a cryostat under high vacuum (<$10^{-3}$ mbar) conditions. Transient PL measurements of the LEP film revealed strong delayed PL at room temperature.

Figure 4A:
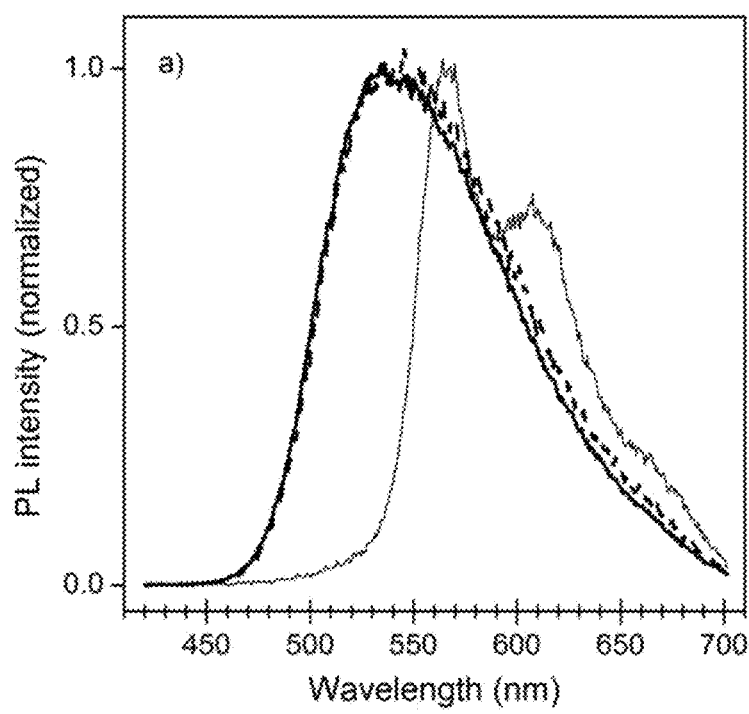
FIG. 4A shows the delayed fluorescence spectrum, the prompt fluorescence spectrum and low temperature delayed phosphorescence spectrum of a light-emitting polymer according to an embodiment of the invention.

As can be seen from FIG. 4A, the delayed PL spectrum of the polymer film (dashed line) is very similar to the prompt one (solid line), indicating that the delayed emission is fluorescence (i.e. originates from singlet exciton states). Fluorescence emission lies in the green region and has broad spectrum, the latter feature being known to be characteristic for charge-transfer (CT) state emission.

The low temperature delayed phosphorescence spectrum of the polymer film is shown overlaid with the prompt and delayed fluorescence spectra.

The delayed PL falls below the detection limit as soon as the film is exposed to air, and recovers back in full once the air is removed from the cryostat. The prompt PL component remains unaffected by air. Such behaviour is consistent with the assumption that the delayed PL originates from triplets, as triplets can be easily quenched by atmospheric oxygen.

Singlet $S_1$=2.47 eV and triplet $T_1$=2.25 eV energy levels of the charge-transfer state were determined from the room temperature prompt and low temperature delayed PL spectra. giving $\Delta E_{S-T}$=220 meV for the single-triplet energy gap of the CT state. Despite being well above room temperature Boltzmann energy, such a single-triplet energy gap is small enough to provide efficient TADF.

Figure 4B:
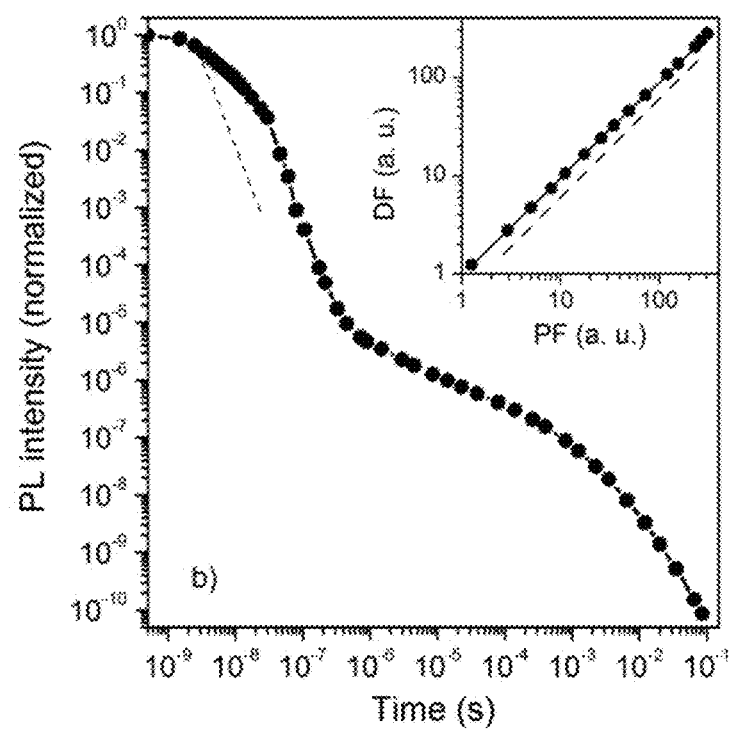
FIG. 4B shows the integrated photoluminescence vs. time of a light-emitting polymer according to an embodiment of the invention.

Decay of the spectrally integrated PL of the LEP film measured at room temperature is shown in FIG. 4B. The PL decay trace consists of the two components corresponding to the prompt fluorescence (PF), and to the delayed fluorescence (DF) characteristic for TADF materials. The dashed line indicates the laser pulse applied to the film.

The inset of FIG. 4B shows the intensity dependence of delayed PL (PF—prompt fluorescence, DF—delayed fluorescence).

Figure 5A:
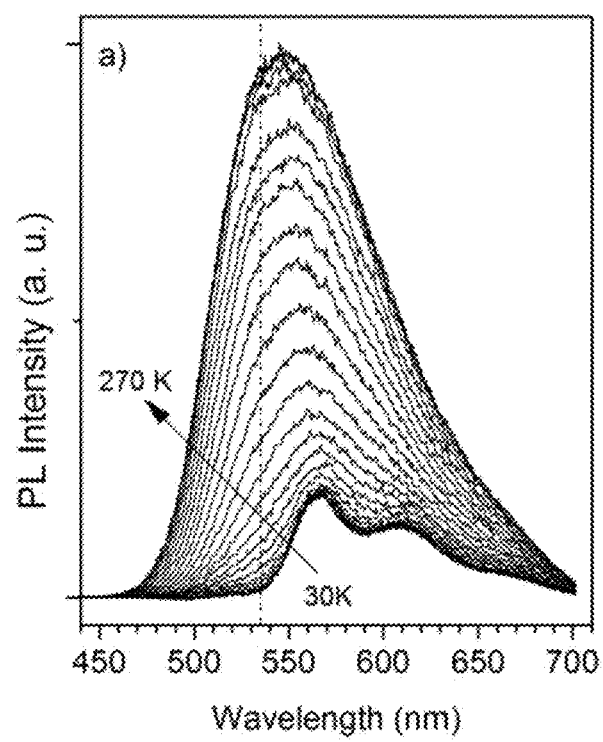
FIG. 5A is a graph of photoluminescent intensity vs. wavelength of a light-emitting polymer according to an embodiment of the invention at different temperatures.

To rule out triplet-triplet annihilation (TTA) as an origin of DF, power and temperature dependencies of the DF of the polymer film were measured. Intensity of the integrated DF at room temperature was found to scale linearly with the intensity of integrated PF within over two orders of magnitude of intensities range, as shown in FIG. 5A. The vertical dashed line separates spectral region (on the left) where DF only is observed.

Figure 5B:
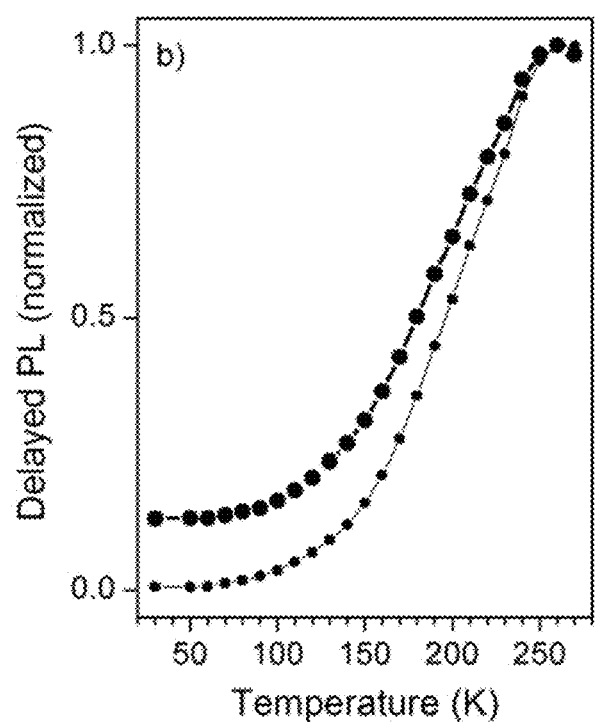
FIG. 5B is a graph of delayed photoluminescence vs. temperature for a light-emitting polymer according to an embodiment of the invention.

Linear power dependence of DF is consistent with TADF rather than with TTA as an origin for DF as in the latter case the DF scales quadratically with PF. Temperature dependence of the delayed PL of the polymer film is shown in FIG. 5B in which the line with large circles indicates integrated delayed photoluminescence, made up of low temperature phosphorescence and delayed fluorescence, and the line with small circles indicates delayed fluorescence only. Intensity of integrated delayed PL increases with increasing temperature and the PL spectrum transforms from phosphorescent to fluorescent, as can be seen from comparison of FIG. 5A and FIG. 4A.

To study temperature dependence of DF, rather than of the total integrated PL, delayed PL was integrated over the spectral region of 450-535 nm where phosphorescence is not observed, assuming that the spectral shape of the DF is not changing significantly with temperature.

Device Example 1

A blue organic light-emitting device having the following structure was prepared:

ITO (45 nm)/HIL (65 nm)/HTL (ca. 15 nm)/LE (80 nm)/Cathode wherein ITO is an indium-tin oxide anode; HIL is a hole-injecting layer; HTL is a hole-transporting layer; LE is a light-emitting layer; and the cathode comprises a layer of sodium fluoride in contact with the light-emitting layer and a layer of silver and a layer of aluminium.

To form the device, a substrate carrying ITO was cleaned using UV/Ozone. The hole injection layer was formed by spin-coating an aqueous formulation of a hole-injection material PEDOT:PSS (20:80 wt %). and heating the resultant layer. The hole transporting layer was formed by spin-coating (poly (2,5-dihexylbenzene-N-(4-(2-butyl)phenyl)-diphenylamine) from a 1 wt % xylene solution and and baking at 170° C. for 1 hour. Subsequent rinsing with xylene leaves a thin ~15 nm layer of reduced solubility upon which the the LEP layer can be spun without significant intermixing. The light-emitting layer was formed by spin-coating Polymer Example 4 from 2 wt % xylene solution and baked at 150° C. for 10 min. The cathode was formed by evaporation of a first layer of sodium fluoride to a thickness of about 2 nm, a second layer of aluminium to a thickness of about 100 nm and a third layer of silver to a thickness of about 100 nm at a pressure of ~$10^{-6}$ mbar. Finally, the device was encapsulated in a glovebox to protect it from moisture and oxygen.

The device produced light in the green region with Commission Internationale de L'Eclairage (CIE) coordinates of about (0.32, 0.58).

Figure 6A:
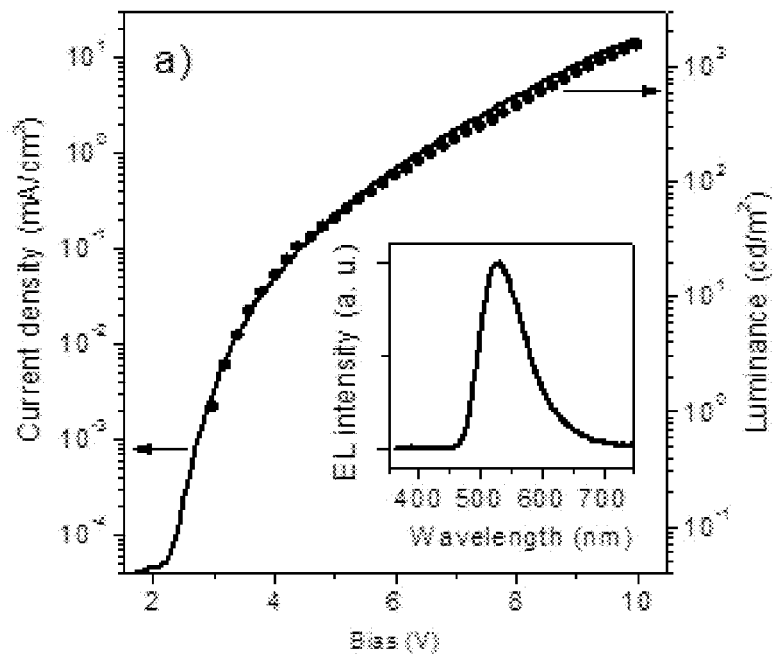
FIG. 6A is a graph of current density vs. bias and a graph of luminance vs. bias for a device according to an embodiment of the invention and, inset, an electroluminescence spectrum of the device.

FIG. 6A is graphs of the current density vs. voltage (solid line) and luminance vs. voltage (dotted line). The electroluminescence spectrum of Device Example 1 is inset in FIG. 6A and is slightly different from the corresponding photoluminescence spectrum due to a cavity effect of the device.

Figure 6B:
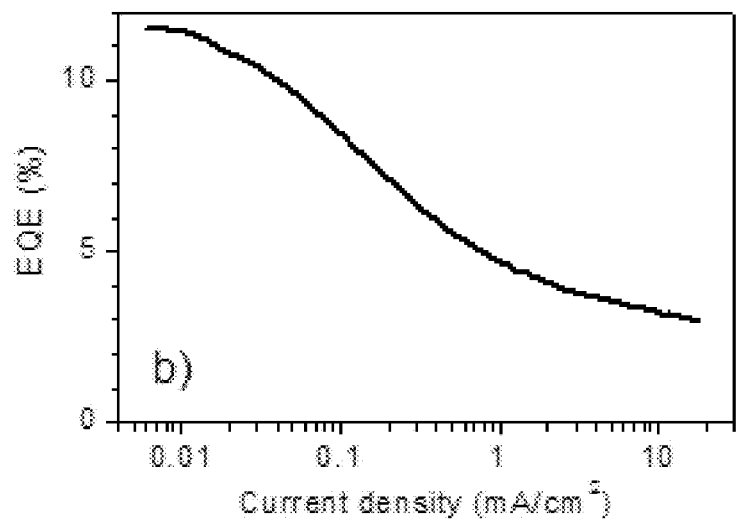
FIG. 6B is a graph of external quantum efficiency vs. current density for a device according to an embodiment of the invention.

With reference to FIG. 6B, the device has an external quantum efficiency of up to about 11.5%.

Figure 5C:
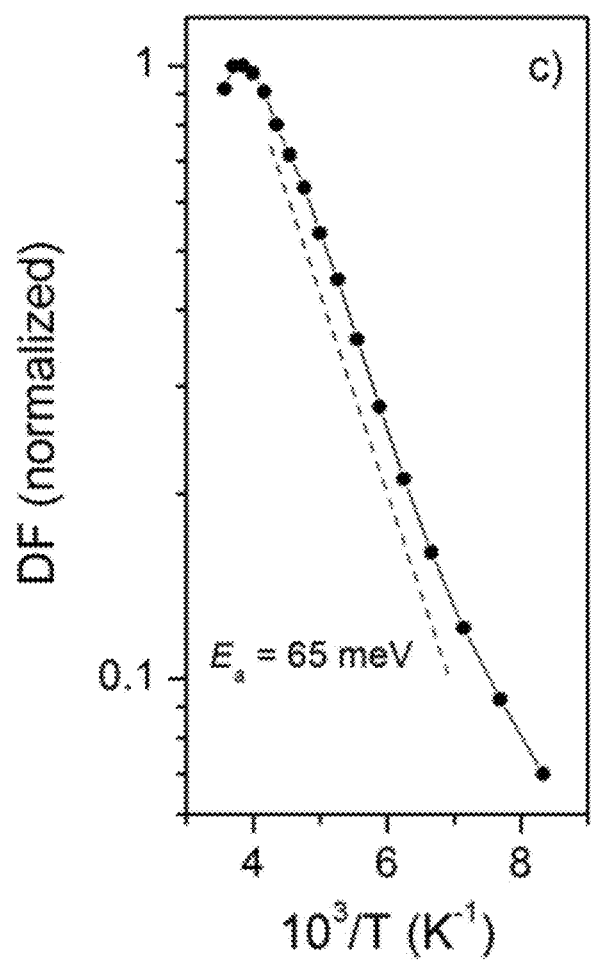
FIG. 5C is an Arrhenius type plot of delayed fluorescence according to an embodiment of the invention.
Figure 7:
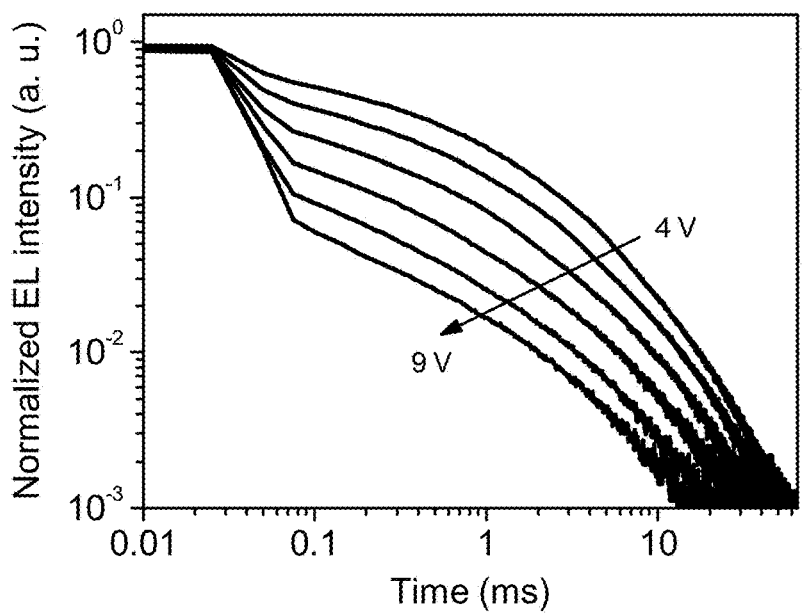
FIG. 7 is a graph of electroluminescence vs. time upon application of bias pulses of 5 ms duration.

To confirm triplet harvesting via reverse intersystem crossing (RISC) and to rule out TTA the EL decays after the end of 5 ms long bias pulses of various amplitudes were measured as shown in FIG. 7. Long EL decays were observed indicating slow triplet conversion to singlets. At long delays device EL decay follows PL decay of the light-emitting polymer film (shown by a circled line in FIG. 5 for comparison). Amplitude of the delayed EL component decreases with the increase of the pulse amplitude but the decay constant remains the same. Such behaviour is consistent with TADF, rather than with TTA, as in the latter case EL decay is expected to become faster with the increase of triplet population. The delayed EL fraction is much higher than the delayed PL fraction as triplets are generated more efficiently by charge carrier injection rather than via intersystem crossing during optical excitation with the 5 ns short laser pulse. Decrease of delayed EL fraction with the increase of the bias pulse amplitude indicates that the EQE roll-off may originate from triplet quenching and, correspondingly, reduced triplet harvesting.

Device Example 2

A device was prepared as described for Device Example 1 except that Polymer Example 2 was used in place of Polymer Example 4.

Device Example 3

A device was prepared as described for Device Example 1 except that Polymer Example 5 was used in place of Polymer Example 4.

Figure 8:
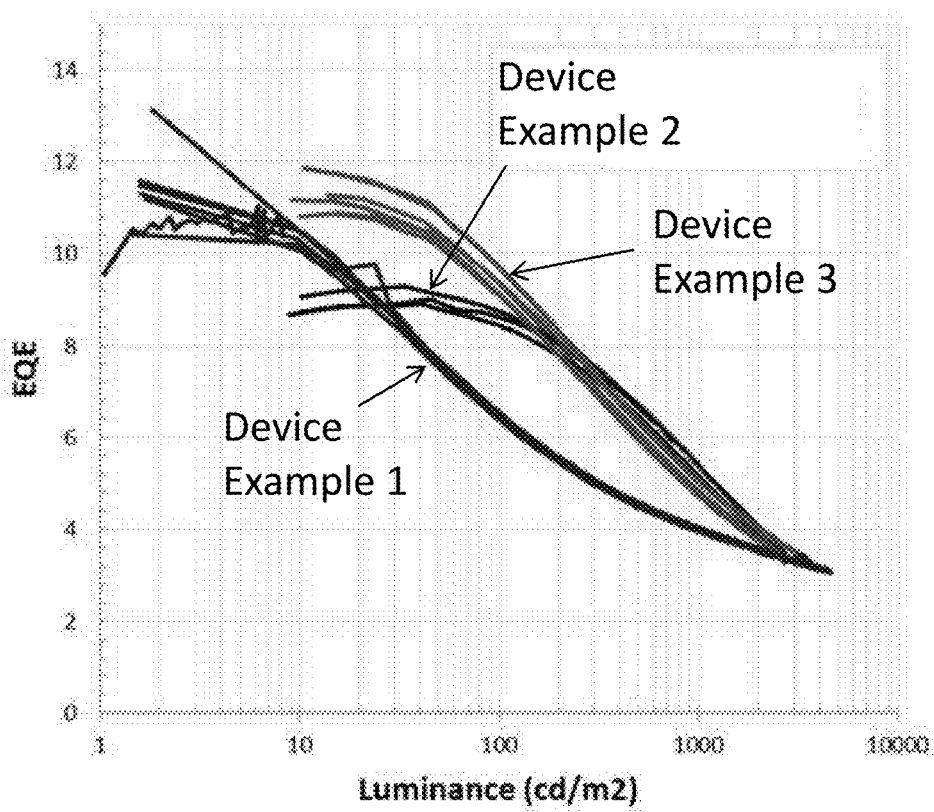
FIG. 8 is a graph of luminance vs. external quantum efficiency for devices according to embodiments of the invention.

With reference to FIG. 8, peak efficiencies of Device Examples 2 and 3 are at a higher brightness than for Device Example 1. Without wishing to be bound by any theory, it is believed that this is due to less conjugation between the electron-accepting and electron-donating units of the light-emitting repeat unit of the light-emitting polymers used in Device Examples 2 and 3 than that of the light-emitting polymer used in Device Example 1.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A polymer comprising a fluorescent light-emitting repeating unit comprising a group of formula ED-EA; and repeat units of formula EA that are not adjacent to units of formula ED, or repeat units of formula ED that are not adjacent to units of formula EA; wherein ED is an electron-donating unit; EA is an electron-accepting unit; and a band gap $Eg_{CT}$ of a charge-transfer state formed from the electron-donating unit and the electron-accepting unit is smaller than the bandgap of either the electron-accepting unit $Eg_{EA}$ or that of the electron-donating unit $Eg_{ED}$.

2. A polymer according to claim 1 wherein the light-emitting repeating unit has formula EA-ED-EA.

3. A polymer according to claim 1 wherein ED has a HOMO value of no more than 6 eV from vacuum level.

4. A polymer according to claim 1 wherein ED has formula (V):

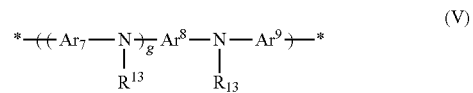

wherein $Ar^7$, $Ar^8$ and $Ar^9$ in each occurrence are independently substituted or unsubstituted aryl or heteroaryl; g is 0 or a positive integer; and each $R^{13}$ independently is a substituent.

5. A polymer according to claim 4 wherein $R^{13}$ is $Ar^{10}$ wherein $Ar^{10}$ is a substituted or unsubstituted aryl or heteroaryl group.

6. A polymer according to claim 4 wherein any of $Ar^7$, $Ar^8$, $Ar^9$ and $Ar^{10}$ bound directly to a N atom in the repeat unit of formula (V) may be linked by a direct bond or a divalent linking atom or group to another of $Ar^7$, $Ar^8$, $Ar^9$ and $Ar^{10}$ bound directly to the same N atom.

7. A polymer according to claim 1 wherein EA has a LUMO value of at least 2.2 eV from vacuum level.

8. A polymer according to claim 1 wherein EA has formula (I):

$$—(Ar^1—Het-Ar^1)— \quad (I)$$

wherein $Ar^1$ in each occurrence is independently an aryl group, Het is a heteroaryl group containing at least one nitrogen atom and $Ar^1$ and Het may each independently be unsubstituted or substituted with one or more substituents.

9. A polymer according to claim 1 wherein the light-emitting repeat unit is in the polymer backbone.

10. A polymer according to claim 1 wherein the polymer comprises one or more repeat units for limiting or breaking conjugation along the polymer backbone.

11. A polymer according to claim 1 wherein the polymer further comprises one or more arylene repeat units.

12. A method of forming a polymer according to claim 1 comprising the steps of polymerising a first monomer comprising the electron-donating unit ED and a second monomer comprising the electron-accepting unit EA.

13. A method according to claim 12 wherein one of the first and second monomers is substituted with two leaving groups selected from halogen, sulfonic acid and sulfonic acid esters, and the other of the first and second monomers is substituted with two leaving groups selected from boronic acid and esters thereof.

14. An organic light-emitting device comprising an anode, a cathode and a light-emitting layer comprising a polymer according to claim 1 between the anode and the cathode.

15. A polymer according to claim 1, wherein a position adjacent to the bond between ED and EA is substituted with a $C_{1-30}$ hydrocarbyl group.

16. A polymer according to claim 1, wherein one of ED and EA comprises a meta-linked phenylene group which is directly bound to the other of ED and EA.

* * * * *